(12) United States Patent
Ohtsubo

(10) Patent No.: US 9,853,072 B2
(45) Date of Patent: Dec. 26, 2017

(54) SOLID-STATE IMAGING ELEMENT AND MANUFACTURING METHOD FOR SOLID-STATE IMAGING ELEMENT

(71) Applicant: Sharp Kabushiki Kaisha, Osaka (JP)

(72) Inventor: Kazuo Ohtsubo, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 19 days.

(21) Appl. No.: 14/389,074

(22) PCT Filed: Feb. 27, 2013

(86) PCT No.: PCT/JP2013/055128
§ 371 (c)(1),
(2) Date: Sep. 29, 2014

(87) PCT Pub. No.: WO2013/146037
PCT Pub. Date: Oct. 3, 2013

(65) Prior Publication Data
US 2015/0060962 A1  Mar. 5, 2015

(30) Foreign Application Priority Data
Mar. 28, 2012  (JP) ................. 2012-074219

(51) Int. Cl.
*H01L 31/113* (2006.01)
*H01L 27/146* (2006.01)

(52) U.S. Cl.
CPC .... *H01L 27/14616* (2013.01); *H01L 27/1461* (2013.01); *H01L 27/14643* (2013.01); *H01L 27/14689* (2013.01)

(58) Field of Classification Search
CPC ......... H01L 27/14603; H01L 27/14616; H01L 27/1461; H01L 27/14643; H01L 27/14689
(Continued)

(56) References Cited

U.S. PATENT DOCUMENTS 6,661,459 B1  12/2003  Koizumi et al.
2005/0082631 A1*  4/2005  Mimuro ............ H01L 27/14601
257/463
(Continued)

FOREIGN PATENT DOCUMENTS

JP  11-274454  10/1999
JP  2007-036083  2/2007
(Continued)

OTHER PUBLICATIONS

Simpson and Weiner, "The Oxford English Dictionary", 1989, Clarendon Press, V 20.*

*Primary Examiner* — Trung Q Dang
*Assistant Examiner* — Patricia Reddington
(74) *Attorney, Agent, or Firm* — Keating & Bennett, LLP

(57) ABSTRACT

Provided are a solid-state imaging element, which suppresses occurrence of a dark current and a white spot and even suppresses occurrence of a residual image, and a manufacturing method for the solid-state imaging element. A solid-state imaging element (1) is provided with: a gate electrode (4) above a substrate (2); a charge storage region (5) formed at a position inside the substrate (2) and apart from a top surface (2a) of the substrate (2); a read region (6) formed at a position inside the substrate (2) and on the opposite side to the charge storage region (5) with the gate electrode (4) interposed therebetween; a channel region (7, 8) formed inside the substrate (2) and immediately below the gate electrode (4); and a shield region (9) and an intermediate region (10) formed inside the substrate (2) and between the top surface (2a) of the substrate (2) and the charge storage region (5). The intermediate region (10) is formed at a position inside the substrate (2) and between the channel region (7, 8) and the shield region (9), and is in contact with each of the channel region (7, 8) and the shield region (9), and a concentration of first conductive type impurities in the
(Continued)

intermediate region (10) is lower than a concentration of the first conductive type impurities in the shield region (9).

5 Claims, 10 Drawing Sheets

(58) Field of Classification Search
USPC .......................................................... 257/291
See application file for complete search history.

(56) References Cited

U.S. PATENT DOCUMENTS

| 2007/0023800 | A1* | 2/2007 | Ohkawa | H01L 27/14601 |
| | | | | 257/292 |
| 2009/0166693 | A1* | 7/2009 | Kim | H01L 27/14603 |
| | | | | 257/292 |

FOREIGN PATENT DOCUMENTS

| JP | 2007036083 A * | 2/2007 |
| JP | 2009-158932 | 7/2009 |
| JP | 4313789 | 8/2009 |

\* cited by examiner

SOLID-STATE IMAGING ELEMENT AND MANUFACTURING METHOD FOR SOLID-STATE IMAGING ELEMENT

CROSS-REFERENCE TO RELATED APPLICATIONS

This application is a National Phase application filed under 35 USC 371 of PCT International Application No. PCT/JP2013/055128 with an International Filing Date of Feb. 27, 2013, which claims under 35 U.S.C. §119(a) the benefit of Japanese Application No. 2012-074219, filed Mar. 28, 2012, the entire contents of which are incorporated herein by reference.

TECHNICAL FIELD

The present invention relates to a solid-state imaging element represented by a CMOS (Complementary Metal Oxide Semiconductor) image sensor, a CCD (Charge Coupled Device) image sensor and the like, and a manufacturing method for the solid-state imaging element.

BACKGROUND ART

In recent years, solid-state imaging elements such as a CCD image sensor and a CMOS image sensor are mounted in imaging devices such as a digital video camera and a digital still camera, and a variety of electronic equipment provided with an imaging function, such as a scanner, a facsimile and a cell phone with a camera. For example, the solid-state imaging element stores, in a charge storage region forming part of the photodiode, electric charges generated by photoelectric conversion of a photodiode formed in a substrate, and also generates a signal constituting image data based on the electric charges read from the charge storage region into a read region at predetermined timing.

Such a solid-state imaging element has a problem of a dark current and a white spot which occur due to electric charges generated not by incidence with light (a phenomenon of a white signal being generated by a large amount of dark current). A dark current and a white spot occur mainly due to supply of electric charges to the charge storage region from interface states on a top surface of the substrate (a surface on a side where a variety of regions such as the charge storage region and a read region are formed, and the same shall apply hereinafter). Therefore, a shield region made up of impurities of a different conductive type from that for the charge storage region has been formed between the top surface of the substrate and the charge storage region, thereby suppressing supply of the electric charges from the interface states on the top surface of the substrate to the charge storage region, to suppress occurrence of a dark current and a white spot.

However, when the shield region as thus described is formed in the substrate, the electric charges pass through the shield region at the time of reading the electric charges from the charge storage region into the read region. At this time, a potential in the shield region becomes significantly large as compared to a potential in the charge storage region, thus leading to deterioration in read efficiency of the electric charges from the charge storage region into the read region. When a large amount of electric charges cannot be read and left in the charge storage region, those electric charges are mixed with electric charges that are stored in the next photoelectric conversion to cause occurrence of a residual image in image data, which is problematic.

Therefore, Patent Document 1 proposes a solid-state imaging element where a channel region is formed immediately below a gate electrode, and part of a charge storage region extends to a place immediately below the gate electrode and is in contact with the channel region. This solid-state imaging element will be described hereinafter with reference to a drawing. It is to be noted that the solid-state imaging element to be described hereinafter is one where an n-type charge storage region is provided in a p-type substrate, and the charge storage region stores electrons.

FIGS. 10A to 10C are diagrams showing a structure and potentials of a conventional solid-state imaging element. FIG. 10A is a diagram showing a cross section of the solid-state imaging element, and a broken arrow in the drawing indicates an electron channel (read channel) at the time of reading electrons stored in a charge storage region 104 into a read region 105 (at the time of read). FIG. 10B shows a potential on the read channel at the time of storing the electrons in the charge storage region 104 (at the time of storage). FIG. 10C shows a potential on the read channel at the time of read.

As shown in FIG. 10A, a solid-state imaging element 100 is provided with: a p-type substrate 101; a gate insulating film 102 formed on a top surface 101a of the substrate 101; a gate electrode 103 formed on the gate insulating film 102; the n-type charge storage region 104 formed at a position inside the substrate 101 and apart from the top surface 101a of the substrate 101; the n-type read region 105 formed at a position inside the substrate 101 and on the opposite side to the charge storage region 104 with the gate electrode 103 interposed therebetween; a p-type first channel region 106 and a p-type second channel region 107 formed at a position inside the substrate 101 and immediately below the gate electrode 103; a p-type shield region 108 formed at a position inside the substrate 101 and between the top surface 101a of the substrate 101 and the charge storage region 104; and an element separation part 109 formed by STI (Shallow Trench Isolation) or the like around an element region of the substrate 101 which is formed with each of the above parts 102 to 108.

Further, in this solid-state imaging element 100, part of the charge storage region 104 is extended to a place immediately below the gate electrode 103 to come into contact with the lower end of the first channel region 106. Moreover, a concentration of p-type impurities in the first channel region 106 is made lower than a concentration of the p-type impurities in the shield region 108, and made higher than a concentration of the p-type impurities in the second channel region 107.

In this solid-state imaging element 100, an electron read channel is one from the charge storage region 104 to the read region 105 through the first channel region 106 and the second channel region 107. Since this reduces a difference between a potential in the charge storage region 104 and a potential on the read channel, it becomes possible to improve the efficiency in reading the electrons from the charge storage region 104 into the read region 105 at the time of read shown in FIG. 10C. Further, since a downward inclination of the potential from the first channel region 106 to the second channel region 107 is formed, at the time of storage shown in FIG. 10B, electric charges supplied from interface states immediately below the gate electrode 103 can be efficiently discharged to the read region 105 where the potential has been reset to a predetermined potential.

PRIOR ART DOCUMENT

Patent Document

Patent Document 1: Japanese Patent No. 4313789

SUMMARY OF THE INVENTION

Problems to be Solved by the Invention

However, in the solid-state imaging element proposed in Patent Document 1, the shield region 108 with a high concentration of the p-type impurities is adjacent to the first channel region 106 forming part of the read channel. For this reason, as shown in FIGS. 10B and 10C, the potential in the first channel region 106 locally increases, to form a potential barrier B. Electrons not able to go over this potential barrier B at the time of read shown in FIG. 10C are left in the charge storage region 104 to cause occurrence of a residual image in image data, which is problematic.

It should be noted that, when the charge storage region 104 is extended to the read region 105 side more than the state shown in FIG. 10A (when the charge storage region 104 led into the place immediately below the gate electrode 103 is made still longer), an influence by the shield region 108 on the read channel can be made smaller, thereby allowing reduction in potential barrier B.

Nevertheless, in order for the charge storage region 104 to be formed as being sufficiently extended toward the read region 105, the charge storage region 104 needs to be formed inside the substrate 101 prior to formation of the gate electrode 103 above the top surface 101a of the substrate 101. In this case, due to variation in alignment at the time of respectively forming the gate electrode 103 and the charge storage region 104, there occurs variation in relative position of the charge storage region 104 with respect to the gate electrode 103 inside the solid-state imaging element 100. When such variation occurs, a height of the potential barrier B varies in each pixel inside the solid-state imaging element 100, and a residual image occurs as varying in each pixel inside the solid-state imaging element 100, which is problematic.

Accordingly, it is an object of the present invention to provide a solid-state imaging element, which suppresses occurrence of a dark current and a white spot and even suppresses occurrence of a residual image, and a manufacturing method for the solid-state imaging element.

Means for Solving the Problem

In order to achieve the above purpose, the present invention provides a solid-state imaging element, comprising: a substrate composed of a semiconductor of a first conductive type; a gate insulating film formed on a top surface of the substrate; a gate electrode formed on the gate insulating film; a charge storage region composed of a semiconductor of a second conductive type different from the first conductive type, and formed at a position inside the substrate and apart from the top surface of the substrate; a read region composed of the second conductive type semiconductor, and formed at a position inside the substrate and on the opposite side to the charge storage region with the gate electrode interposed therebetween; a channel region composed of the first conductive type semiconductor, and formed at a position inside the substrate and immediately below the gate electrode; a shield region composed of the first conductive type semiconductor, and formed at a position inside the substrate and between the top surface of the substrate and the charge storage region; and an intermediate region composed of the first conductive type semiconductor, and formed at a position inside the substrate and between the top surface of the substrate and the charge storage region, wherein the charge storage region extends to a place immediately below the gate electrode inside the substrate and is in contact with a lower end of the channel region, the intermediate region is formed at a position inside the substrate and between the channel region and the shield region and is in contact with each of the channel region and the shield region, and a concentration of impurities of the first conductive type in the intermediate region is lower than a concentration of the impurities of the first conductive type in the shield region.

According to this solid-state imaging element, the intermediate region where the concentration of the first conductive type impurities is lower than that in the shield region is formed between the shield region and the channel region. This allows reduction in potential barrier in the channel region.

It is to be noted that the "first conductive type substrate" means a substrate where a portion to be formed with an element structure is composed of the first conductive type semiconductor, and it is not restricted to a substrate entirely composed of the first conductive type semiconductor, but naturally includes a substrate with a well composed of the first conductive type semiconductor (e.g., a substrate which is formed with a well composed of the first conductive type semiconductor by injecting the first conductive type impurities into a substrate entirely composed of the second conductive type semiconductor).

Further, in the solid-state imaging element with the above characteristics, it is preferable that the concentration of the first conductive type impurities in the intermediate region is higher than the concentration of the first conductive type impurities in the channel region.

According to this solid-state imaging element, even when the top surface of the substrate except for a place immediately below the gate electrode (immediately above the channel region) is damaged by etching at the time of forming the gate electrode and the gate insulating film to increase a density of interface states, by providing the intermediate region where the concentration of the first conductive type impurities is higher than that in the channel region, it becomes possible to suppress supply of electrons that cause a dark current and a white spot.

Further, in the solid-state imaging element with the above characteristics, it is preferable that the concentration of the first conductive type impurities in the shield region is not lower than $1 \times 10^{18}$ cm$^{-3}$ and not higher than $1 \times 10^{19}$ cm$^{-3}$, the concentration of the first conductive type impurities in the intermediate region is not lower than $3 \times 10^{17}$ cm$^{-3}$ and not higher than $3 \times 10^{18}$ cm$^{-3}$, and the concentration of the first conductive type impurities in the channel region is not lower than $3 \times 10^{16}$ cm$^{-3}$ and not higher than $3 \times 10^{17}$ cm$^{-3}$.

According to this solid-state imaging element, since the concentration of the first conductive type impurities in the shield region becomes sufficiently high, it becomes possible to suppress supply of the electrons which cause a dark current and a white spot from the interface states formed on the top surface of the substrate to the charge storage region. Further, since the concentration of the first conductive type impurities in the channel region becomes sufficiently low, it becomes possible to efficiently read electrons at the time of read. Moreover, since the concentration of the first conductive type impurities in the intermediate region becomes suitable, it becomes possible to effectively reduce the potential barrier in the channel region, and also effectively suppress supply of the electrons that cause a dark current and a white spot.

Further, in the solid-state imaging element with the above characteristics, it is preferable that a portion of the charge storage region, which extends to the place immediately below the gate electrode, has a length not smaller than 50 nm and not larger than 250 nm.

According to this solid-state imaging element, impurities of the second conductive type are injected into the top surface of the substrate, thereby to allow formation of the charge storage region after formation of the gate electrode. That is, it becomes possible to eliminate the need for forming the charge storage region by injecting the second conductive type impurities into the top surface of the substrate prior to formation of the gate electrode. Hence it becomes possible to suppress variation in relative position of the charge storage region with respect to the gate electrode inside the solid-state imaging element.

Further, in the solid-state imaging element with the above characteristics, it is preferable that a side wall formed on a side surface of the gate electrode is further comprised, and the intermediate region is formed at a position inside the substrate and immediately below the side wall.

According to this solid-state imaging element, it becomes possible to form the intermediate region with respect to the gate electrode in a self-matching manner, and also form the shield region with respect to the side wall in a self-matching manner, so as to suppress variation in relative positional relations of the intermediate region and the shield region with respect to the channel region. Therefore, it becomes possible to accurately reduce the potential barrier in the channel region, so as to prevent occurrence of variation in a residual image in each pixel inside the solid-state imaging element.

Further, in the solid-state imaging element with the above characteristics, it is preferable that the channel region is made up of a first channel region in contact with the charge storage region, and a second channel region in contact with the read region and the first channel region, and the second channel region is formed expanding to a position more apart from the top surface of the substrate than the first channel region.

According to this solid-state imaging element, the second channel region on the read region side is formed so as to be deeper than the first channel region on the charge storage region side inside the substrate. Hence it becomes possible to suppress punch-through between the charge storage region and the read region.

Moreover, the present invention provides a manufacturing method for the solid-state imaging element, the method comprising: a first step of injecting impurities of a first conductive type into a top surface of a substrate composed of a semiconductor of the first conductive type, to form a channel region inside the substrate; a second step of forming a gate electrode via a gate insulating film at a position on the top surface of the substrate and immediately above the channel region; a third step of respectively injecting impurities of a second conductive type different from the first conductive type at respective positions being on the top surface of the substrate and sandwiching the gate electrode, to respectively form a charge storage region and a read region inside the substrate; a fourth step of injecting the first conductive type impurities into the top surface of the substrate, to form an intermediate region at a position inside the substrate and between the top surface of the substrate and the charge storage region; and a fifth step of injecting the first conductive type impurities into the top surface of the substrate, to form a shield region at a position inside the substrate and between the top surface of the substrate and the charge storage region, wherein the second conductive type impurities are injected from an injection direction inclined from a vertical direction to the top surface of the substrate just by a predetermined angle at the time of forming the charge storage region in the third step, to form the charge storage region which extends to a place immediately below the gate electrode and is in contact with a lower end of the channel region, the first conductive type impurities are injected at a position being in the top surface of the substrate and adjacent to the place immediately below the gate electrode in the fourth step and the first conductive type impurities are injected at a position being in the top surface of the substrate and apart from the place immediately below the gate electrode in the fifth step, to form the intermediate region, which is in contact with each of the channel region and the shield region, at a position inside the substrate and between the channel region and the shield region, and a concentration of the first conductive type impurities in the intermediate region is made lower than a concentration of the first conductive type impurities in the shield region.

According to this manufacturing method for the solid-state imaging element, the intermediate region, where a concentration of the first conductive type impurities is lower than that in the shield region, is formed between the shield region and the channel region, thereby to allow manufacturing of a solid-state imaging element where the potential barrier in the channel region is reduced. Further, according to this manufacturing method for the solid-state imaging element, each region inside the substrate can be formed with respect to the gate electrode in a self-matching manner.

Effect of the Invention

According to the solid-state imaging element with the above characteristics, it becomes possible to reduce the potential barrier in the channel region while providing the shield region for suppressing a dark current and a white spot. Hence it becomes possible to suppress occurrence of a dark current and a white spot and even suppress occurrence of a residual image. Further, according to the manufacturing method for the solid-state imaging element with the above characteristics, it becomes possible to suppress relative displacement, so as to accurately manufacture the solid-state imaging element which can suppress occurrence of a dark current and a white spot and can even suppress occurrence of a residual image.

DESCRIPTION OF EMBODIMENT

<Structural Example of Solid-State Imaging Element>

A structural example of a solid-state imaging element according to an embodiment of the present invention will be described with reference to the drawings. However, for embodying the description, a case will be shown hereinafter where a solid-state imaging element as a CMOS image sensor is provided with an n-type charge storage region in a p-type substrate, and the charge storage region stores electrons. It is to be noted that the "p-type substrate" means a substrate where a portion to be formed with an element structure is the p type, and it is not restricted to a substrate being entirely the p type, but it naturally includes a substrate with a well being the p type (e.g., a substrate which is formed with a p-type well by injecting the p-type impurities into a substrate being entirely the n type). However, it is assumed that in each drawing to be referenced in the following description, the substrate is illustrated as if being entirely the p type.

Further, silicon can be used as a material for the substrate. In this case, boron or the like can be used as the p-type impurities. Further, in this case, phosphorus or arsenic can be used as the n-type impurities. Moreover, these impurities can be injected into the substrate by using a method such as ion plantation. It is to be noted that for embodying the description, a case where the substrate is composed of silicon will be illustrated hereinafter.

Figure 1A:
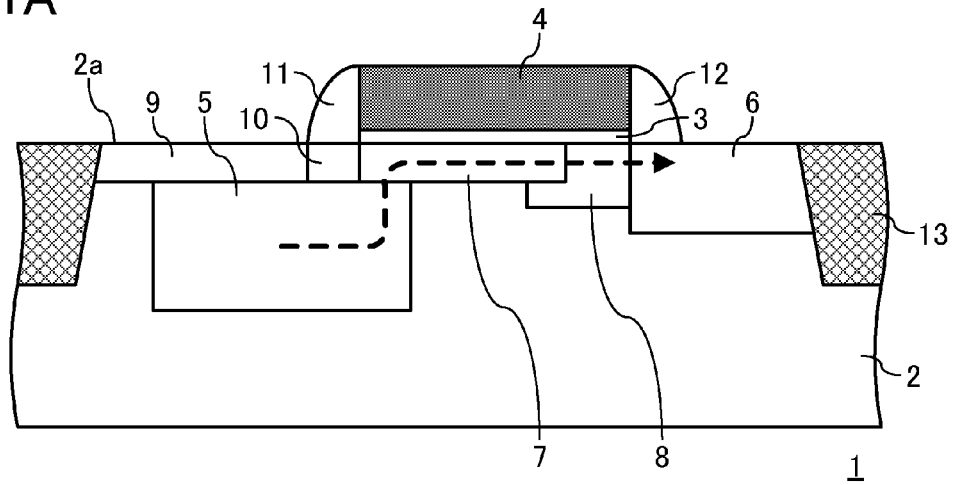
FIGS. 1A to 1C are sectional views showing a structural example and potential examples of a solid-state imaging element according to an embodiment of the present invention.
Figure 1B:
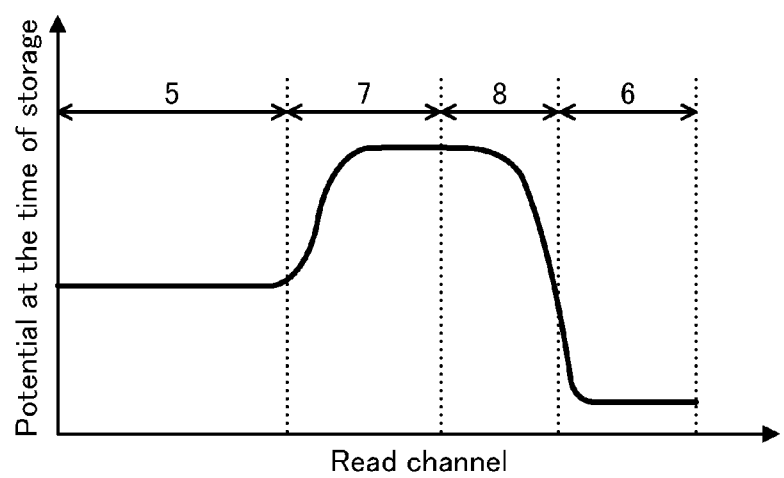
Figure 1C:
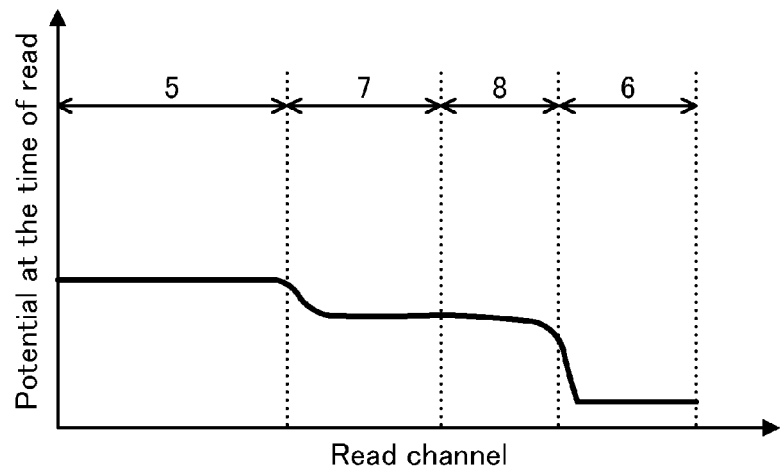

FIGS. 1A to 1C are sectional views showing a structural example and potential examples of the solid-state imaging element according to the embodiment of the present invention. FIG. 1A is a view showing a cross section of the solid-state imaging element, and a broken arrow in the drawing indicates an electron channel (read channel) at the time of reading electrons stored in a charge storage region 5 into a read region 6 (at the time of read). FIG. 1B shows a potential on the read channel at the time of storing the electrons in the charge storage region 5 (at the time of storage). FIG. 1C shows a potential on the read channel at the time of read.

As shown in FIG. 1A, a solid-state imaging element 1 is provided with: a p-type substrate 2; a gate insulating film 3 formed on a top surface 2a of the substrate 2; a gate electrode 4 formed on the gate insulating film 3; the n-type charge storage region 5 formed at a position inside the substrate 2 and apart from the top surface 2a of the substrate 2; the n-type read region 6 formed at a position inside the substrate 2 and on the opposite side to the charge storage region 5 with the gate electrode 4 interposed therebetween; a p-type first channel region 7 and a p-type second channel region 8 formed at a position inside the substrate 2 and immediately below the gate electrode 4; a p-type shield region 9 formed at a position inside the substrate 2 and between the top surface 2a of the substrate 2 and the charge storage region 5; a p-type intermediate region 10 formed at a position inside the substrate 2 and between the top surface 2a of the substrate 2 and the charge storage region 5; side walls 11, 12 formed on a side surface of the gate electrode 4; and an element separation part 13 formed by STI (Shallow Trench Isolation) or the like around an element region of the substrate 2 which is formed with each of the above parts 3 to 12.

The gate insulating film 3 is made up of silicon oxide, for example, and the gate electrode 4 is made up of polysilicon, for example. Further, the gate electrode 4 has a film thickness not smaller than 100 nm and not larger than 250 nm, for example.

A concentration of the n-type impurities in the charge storage region 5 is not lower than $1\times10^{17}$ cm$^{-3}$ and not higher than $1\times10^{18}$ cm$^{-3}$, for example, and is lower than a concentration of the n-type impurities in the read region 6. Further, the charge storage region 5 extends to a place immediately below the gate electrode 4 inside the substrate 2, and is in contact with a lower end of the first channel region 7. The existence of this portion extending to the place immediately below the gate electrode 4 leads to formation of a read channel for reading electrons from the charge storage region 5 into the first channel region 7 via this portion. This portion of the charge storage region 5, which extends to the place immediately below the gate electrode 4, has a length not smaller than 50 nm and not larger than 250 nm. It is more preferably not smaller than 100 nm and not larger than 200 nm.

When the portion of the charge storage region 5 which extends to the place immediately below the gate electrode 4 has the length being the above value, the charge storage region 5 can be formed by injecting the n-type impurities into the top surface 2a of the substrate 2 after formation of the gate electrode 4 (a detailed description will be given in an example of a manufacturing method to be described later). That is, it becomes possible to eliminate the need for forming the charge storage region 5 by injecting the n-type impurities into the top surface 2a of the substrate 2 prior to formation of the gate electrode 4. Hence it becomes possible to suppress variation in relative position of the charge storage region 5 with respect to the gate electrode 4 in each pixel inside the solid-state imaging element 1.

The first channel region 7 is formed at a position inside the substrate 2 and in contact with the charge storage region 5. Further, the second channel region 8 is formed at a position inside the substrate 2 and in contact with the read region 6 and the first channel region 7. Moreover, the second channel region 8 is formed expanding to a position more apart from the top surface 2a of the substrate 2 than the first channel region 7. In such a manner, inside the substrate 2, when the second channel region 8 on the read region 6 side is formed so as to be deeper than the first channel region 7 on the charge storage region 5 side, it becomes possible to suppress punch-through between the charge storage region 5 and the read region 6.

The intermediate region 10 is formed at a position inside the substrate 2 and between the first channel region 7 and the shield region 9, and is in contact with each of the first channel region 7 and the shield region 9. Further, the intermediate region 10 is formed at a position inside the substrate 2 and immediately below the side wall 11 formed on a side surface of the gate electrode 4 on the charge storage region 5 side. It is to be noted that the side walls 11, 12 are made up of silicon oxide or silicon nitride, or one formed by laminating these, for example. Moreover, the side wall 12 is one formed on a side surface of the gate electrode 4 on the read region 6 side.

A concentration of p-type impurities in the intermediate region 10 is lower than a concentration of the p-type impurities in the shield region 9, and is higher than a concentration of the p-type impurities in the first channel region 7 and the second channel region 8. Specifically, the concentration of the p-type impurities in the intermediate region 10 is not lower than $3 \times 10^{17}$ cm$^{-3}$ and not higher than $3 \times 10^{18}$ cm$^{-3}$, the concentration of the p-type impurities in the shield region 9 is not lower than $1 \times 10^{18}$ cm$^{-3}$ and not higher than $1 \times 10^{19}$ cm$^{-3}$, and the concentration of the p-type impurities in the first channel region 7 and the second channel region 8 is not lower than $3 \times 10^{16}$ cm$^{-3}$ and not higher than $3 \times 10^{17}$ cm$^{-3}$.

Figure 10A:
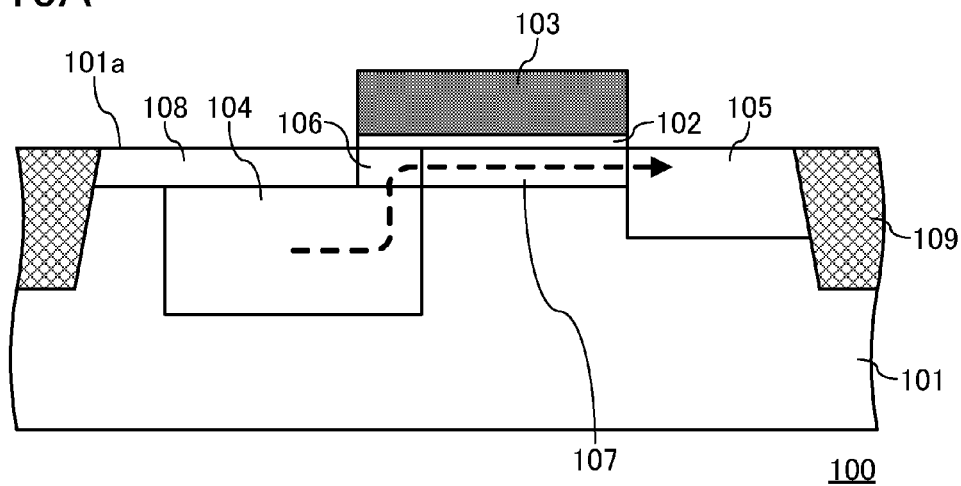
FIGS. 10A to 10C are diagrams showing a structure and potentials of the conventional solid-state imaging element.
Figure 10B:
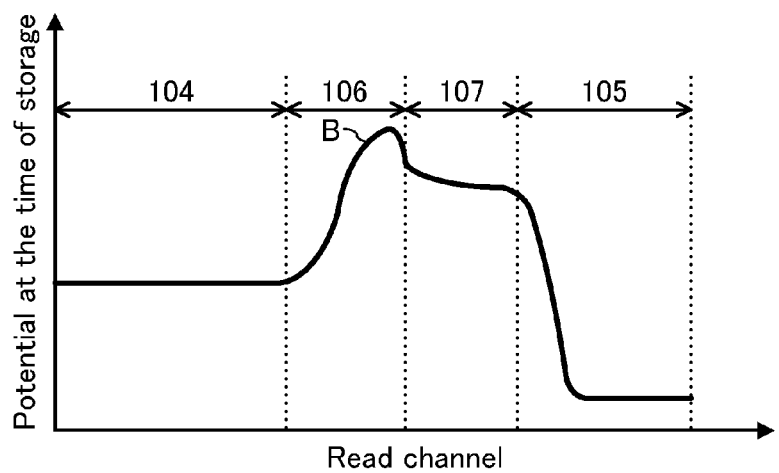
Figure 10C:
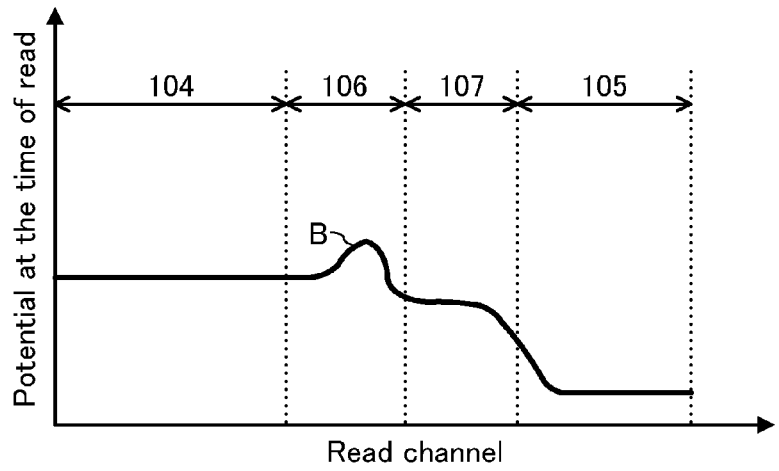

In the solid-state imaging element 1, in order to suppress supply of electrons which cause a dark current and a white spot from interface states formed on the top surface 2a of the substrate 2 to the charge storage region 5, the concentration of the p-type impurities in the shield region 9 needs to be made sufficiently high as the above value. Meanwhile, in order to efficiently read the electrons at the time of read, the concentration of the p-type impurities in the first channel region 7 and the second channel region 8 needs to be made sufficiently low as the above value. For this reason, as described with reference to FIGS. 10A to 10C, when it is structured that the shield region 108 and the first channel region 106 are adjacent with each other, the potential barrier B is formed in the first channel region 106 due to an influence by the shield region 108, to cause occurrence of a residual image in image data.

Therefore, in the solid-state imaging element 1 according to the embodiment of the present invention, the intermediate region 10 where the concentration of the p-type impurities are lower than that in the shield region 9 is formed between the shield region 9 and the first channel region 7. Hence it becomes possible to reduce the potential barrier B (cf. FIGS. 10A to 10C) in the first channel region 7 as shown in FIGS. 1B and 1C. In particular, by setting the concentration of the p-type impurities in the intermediate region 10 to the above value, it becomes possible to effectively reduce the potential barrier B (cf. FIGS. 10A to 10C) in the first channel region 7.

From the above, in the solid-state imaging element 1 according to the embodiment of the present invention, it becomes possible to reduce the potential barrier B (cf. FIG. 10) in the first channel region 7 while providing the shield region 9 for suppressing a dark current and a white spot. Hence it becomes possible to suppress occurrence of a dark current and a white spot and even suppress occurrence of a residual image.

Moreover, it is preferable to make the concentration of the p-type impurities in the intermediate region 10 higher than the concentration of the p-type impurities in the first channel region 7 and the second channel region 8 as described above. While a detailed description will be given in an example of the manufacturing method to be described later, formation of the gate electrode 4 and the gate insulating film 3 requires etching, and when the etching is performed, the top surface 2a of the substrate 2 except for the place immediately below the gate electrode 4 is damaged, thereby to increase a density of the interface states. That is, as compared to the top surface 2a of the substrate 2 which is immediately below the gate electrode 4 (immediately above the first channel region 7 and the second channel region 8), the other top surface 2a of the substrate 2 (immediately above the intermediate region 10 and the charge storage region 5) becomes easier to supply the electrons that cause a dark current and a white spot. Therefore, by making the concentration of the p-type impurities in the intermediate region 10 higher than the concentration of the p-type impurities in the first channel region 7 and the second channel region 8, it becomes possible to suppress supply of the electrons that cause a dark current and a white spot. In particular, by setting the concentration of the p-type impurities in the intermediate region 10 to the above value, it becomes possible to effectively suppress supply of the electrons that cause a dark current and a white spot.

It should be noted that, although not particularly shown in FIG. 1A, the top surface 2a of the substrate 2 which is immediately above the charge storage region 5 may be provided with an optical member such as a color filter or a microlens via an interlayer insulating film made up of silicon oxide, for example. That is, the solid-state imaging element 1 may be a front-surface irradiation type CMOS image sensor. Alternatively, as opposed to this, the opposite-side surface of the substrate 2 to the top surface 2a may be provided with the optical member such as the color filter or the microlens via the interlayer insulating film made up of silicon oxide, for example. That is, the solid-state imaging element 1 may be a rear-surface irradiation type CMOS image sensor. In either CMOS image sensor, light having passed through the optical member is subjected to photoelectric conversion by a photodiode made up of the charge storage region 5 and the substrate 2, and electrons generated thereby are stored into the charge storage region 5.

<Example of Manufacturing Method for Solid-State Imaging Element>

Next, the manufacturing method for the solid-state imaging element 1 shown in FIG. 1A will be described with reference to FIGS. 2 to 9. FIGS. 2 to 9 are sectional views showing examples of the manufacturing method for the solid-state imaging element according to the embodiment of the present invention.

Figure 2:
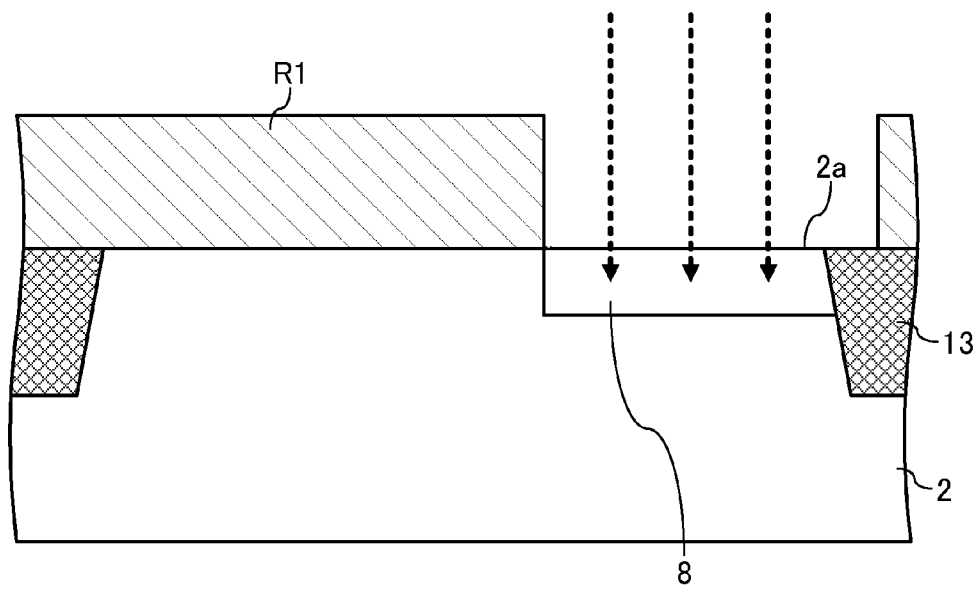
FIG. 2 is a sectional view showing an example of a manufacturing method for a solid-state imaging element according to the embodiment of the present invention.

First, as shown in FIG. 2, a resist R1 is formed by photolithography or the like on the top surface 2a of the substrate 2 formed with the element separation part 13. This resist R1 is open immediately above a position to be eventually formed with the read region 6 and the second channel region 8 (cf. FIGS. 1A to 1C). Then, the p-type impurities are injected with this resist R1 used as a mask, to form the second channel region 8. Thereafter, this resist R1 is removed.

Figure 3:
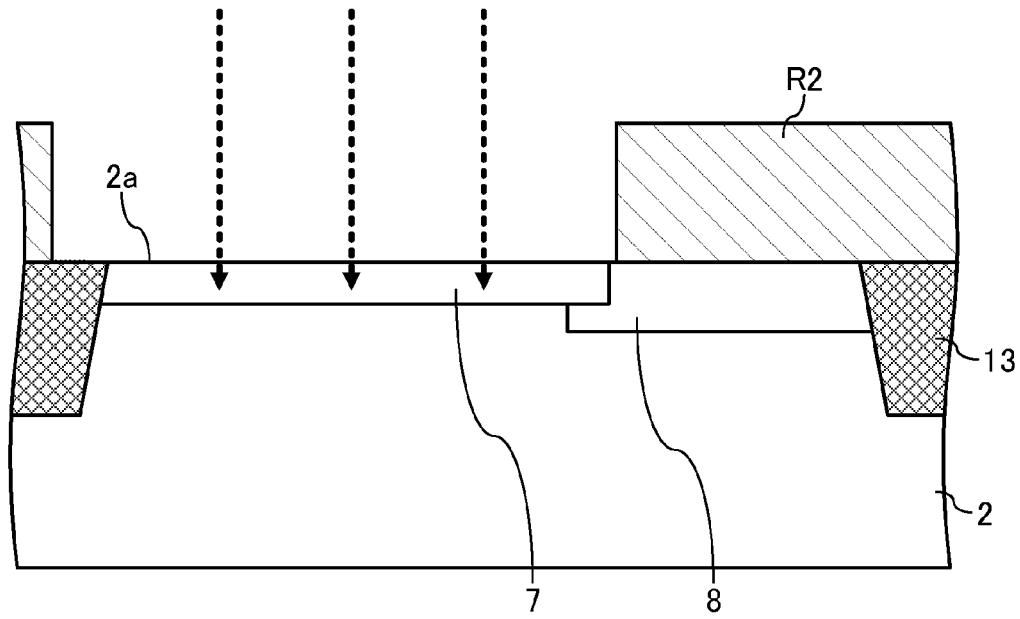
FIG. 3 is a sectional view showing an example of the manufacturing method for the solid-state imaging element according to the embodiment of the present invention.

Next, as shown in FIG. 3, a resist R2 is formed by photolithography or the like with respect to the top surface 2a of the substrate 2. This resist R2 is open immediately above a position to be eventually formed with the first channel region 7, the shield region 9 and the intermediate region 10 (cf. FIGS. 1A to 1C). Then, the p-type impurities are injected with this resist R2 used as a mask, to form the first channel region 7. Thereafter, this resist R2 is removed.

Figure 4:
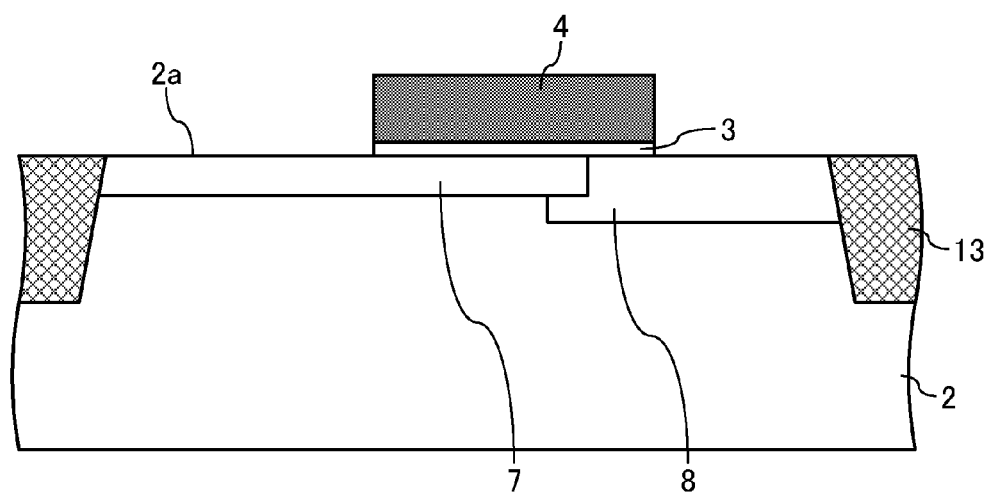
FIG. 4 is a sectional view showing an example of the manufacturing method for the solid-state imaging element according to the embodiment of the present invention.

Next, as shown in FIG. 4, the gate electrode 4 is formed via the gate insulating film 3 at a position immediately above a position which is on the top surface 2a of the substrate 2 and is to be eventually formed with the first channel region 7 and the second channel region 8 (cf. FIGS. 1A to 1C). For example, at this time, the top surface 2a of the substrate 2 is thermally oxidized to form a silicon oxide film, and a polysilicon film is further formed thereabove by CVD (Chemical Vapor Deposition) or the like. Then, a resist is formed on a top surface of a portion to eventually become the gate electrode 4 (cf. FIGS. 1A to 1C) by photolithography or the like, which is further dry-etched, thereby selectively removing the polysilicon film and the silicon oxide film, to form the gate insulating film 3 and the gate electrode 4. Thereafter, the resist is removed.

Figure 5:
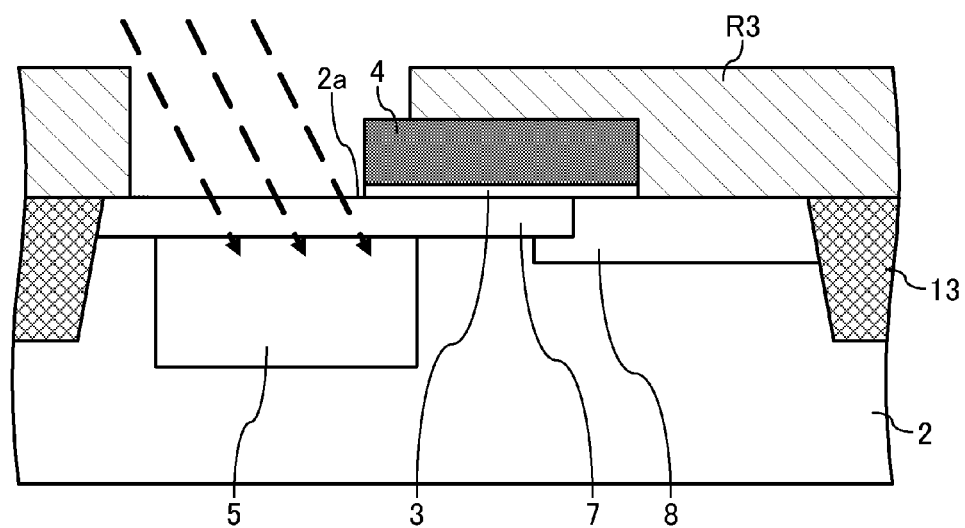
FIG. 5 is a sectional view showing an example of the manufacturing method for the solid-state imaging element according to the embodiment of the present invention.

Next, as shown in FIG. 5, a resist R3 is formed by photolithography or the like with respect to the top surface 2a of the substrate 2 and the gate electrode 4. This resist R3 is open immediately above a position to be eventually formed with the charge storage region 5 (cf. FIGS. 1A to 1C). Then, the n-type impurities are injected with this resist R3 and the gate electrode 4 used as a mask, to form the charge storage region 5.

However, at this time, the n-type impurities are injected from an injection direction which is inclined from a vertical direction to the top surface 2a of the substrate 2 so as to be away from the gate electrode 4 by just a predetermined angle (e.g., not smaller than 3 degrees and not larger than 10 degrees). Thereby, the charge storage region 5, which extends to the place immediately below the gate electrode 4 and is in contact with the lower end of the first channel region 7, is formed with respect to the gate electrode 4 in a self-matching manner. Thereafter, the resist R3 is removed.

After injection of the n-type impurities, the charge storage region 5 expands around itself (the n-type impurities are diffused) by thermal treatment performed at arbitrary timing, and a length of the portion extending to the place immediately below the gate electrode 4 becomes a length of not smaller than 50 nm and not larger than 250 nm. It should be noted that the length of the portion of the charge storage region 5 which extends to the place immediately below the gate electrode 4 at a point in time immediately after injection of the n-type impurities is not smaller than 5 nm and not larger than 50 nm, for example.

Figure 6:
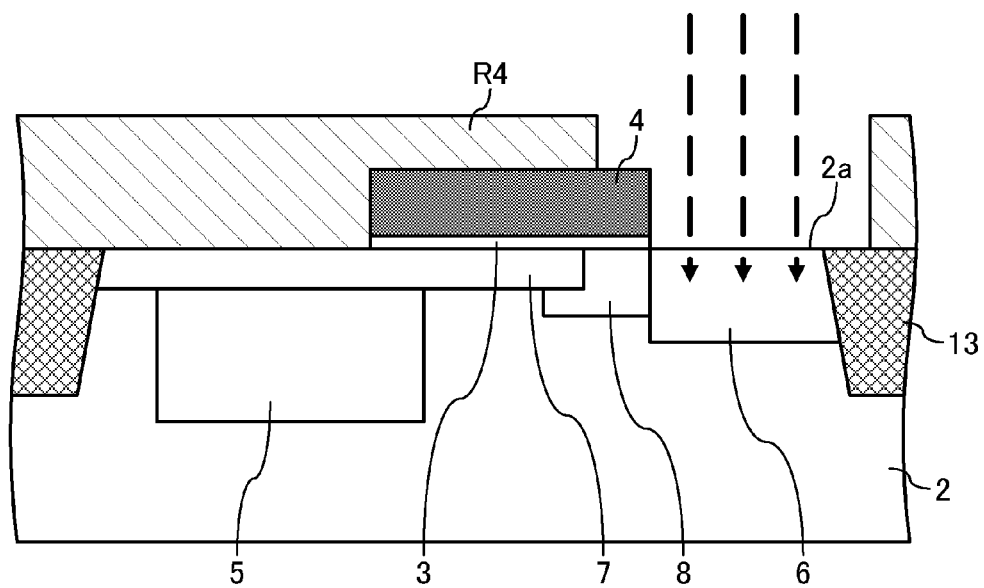
FIG. 6 is a sectional view showing an example of the manufacturing method for the solid-state imaging element according to the embodiment of the present invention.

Next, as shown in FIG. 6, a resist R4 is formed by photolithography or the like with respect to the top surface 2a of the substrate 2 and the gate electrode 4. This resist R4 is open immediately above a position to be eventually formed with the read region 6 (cf. FIGS. 1A to 1C). The n-type impurities are injected with this resist R4 and the gate electrode 4 used as a mask, to form the read region 6 with respect to the gate electrode 4 in a self-matching manner. Thereafter, the resist R4 is removed.

Figure 7:
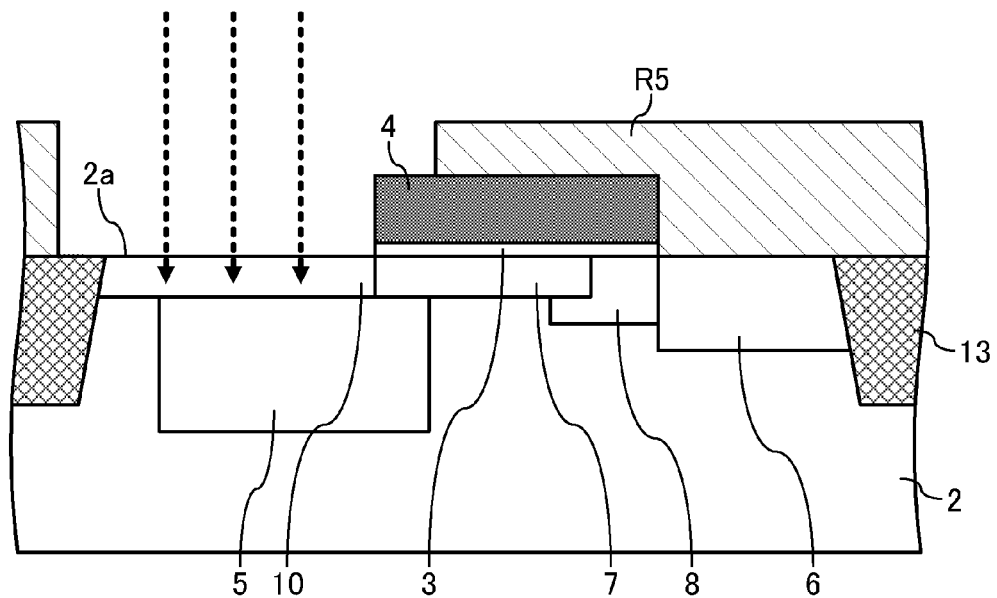
FIG. 7 is a sectional view showing an example of the manufacturing method for the solid-state imaging element according to the embodiment of the present invention.

Next, as shown in FIG. 7, a resist R5 is formed by photolithography or the like with respect to the top surface 2a of the substrate 2 and the gate electrode 4. This resist R5 is open immediately above a position to be eventually formed with the shield region 9 and the intermediate region 10 (cf. FIGS. 1A to 1C). The p-type impurities are injected with this resist R5 and the gate electrode 4 used as a mask, to form the intermediate region 10 with respect to the gate electrode 4 in a self-matching manner. Thereafter, the resist R5 is removed.

Figure 8:
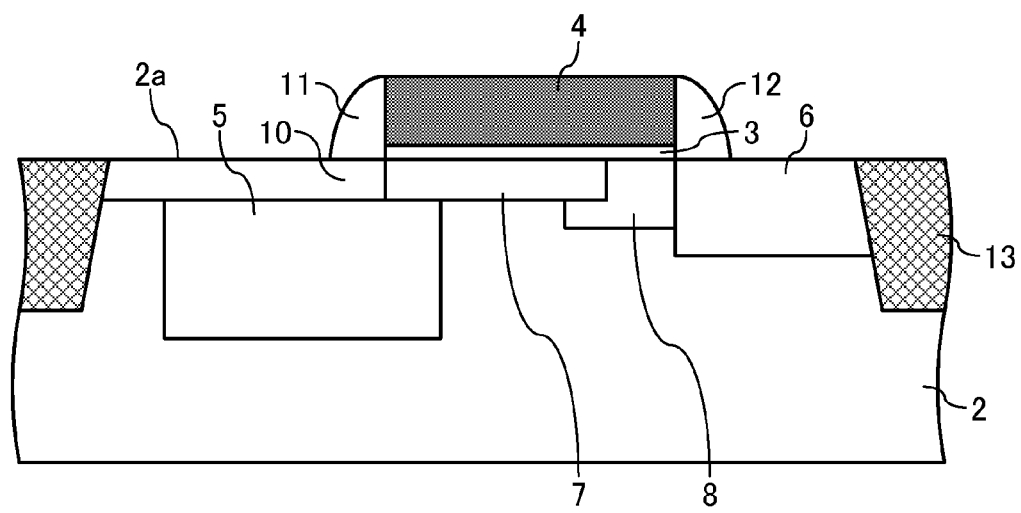
FIG. 8 is a sectional view showing an example of the manufacturing method for the solid-state imaging element according to the embodiment of the present invention.

Next, as shown in FIG. 8, the side walls 11, 12 are formed with respect to the side surface of the gate electrode 4. At this time, for example, a film made up of silicon oxide or silicon nitride, or one formed by laminating these, is formed by CVD or the like with respect to the entire surface of the top surface 2a of the substrate 2. The entire surface of the film is dry-etched to selectively leave the film at an etching-resistant step portion formed by the top surface 2a of the substrate 2 and the side surface of the gate electrode 4, thereby forming each of the side walls 11, 12. That is, the side walls 11, 12 are formed with respect to the gate electrode 4 in a self-matching manner.

Figure 9:
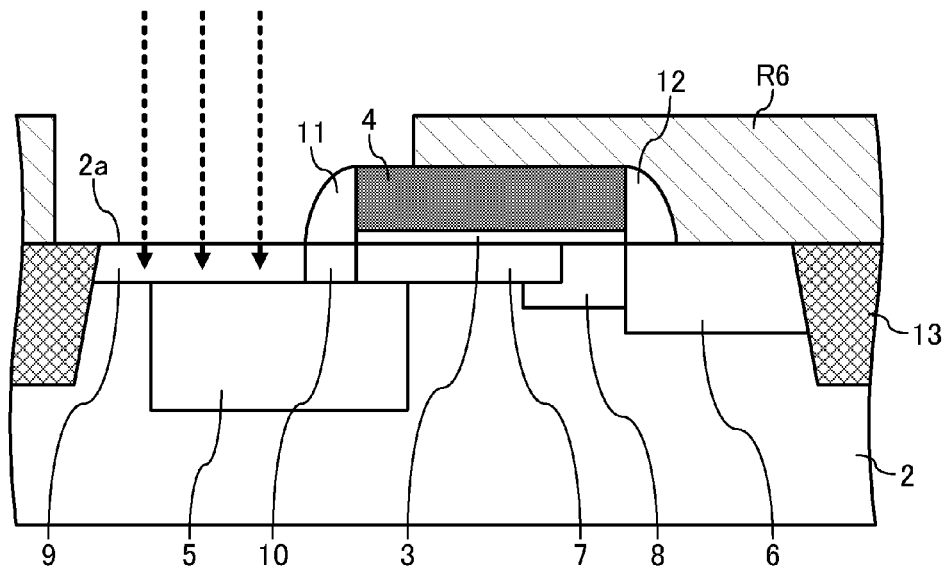
FIG. 9 is a sectional view showing an example of the manufacturing method for the solid-state imaging element according to the embodiment of the present invention.

Next, as shown in FIG. 9, a resist R6 is formed by photolithography or the like with respect to the top surface 2a of the substrate 2 and the gate electrode 4. This resist R6 is open immediately above a position to be eventually formed with the shield region 9 (cf. FIGS. 1A to 1C). The p-type impurities are injected with this resist R6, the gate electrode 4 and the side wall 11 used as a mask, to form the shield region 9 with respect to the side wall 11 in a self-matching manner. Thereafter, the resist R6 is removed.

In the above manufacturing method for the solid-state imaging element 1, it becomes possible to form the respective regions 5, 6, 9, 10 inside the substrate 2 with respect to the gate electrode 4 in a self-matching manner. Hence it becomes possible to suppress relative displacement, so as to accurately manufacture the solid-state imaging element 1 which can suppress occurrence of a dark current and a white spot and can even suppress occurrence of a residual image.

Especially, by forming the intermediate region 10 with respect to the gate electrode 4 in a self-matching manner as shown in FIG. 7 and also forming the shield region 9 with respect to the side wall 11 in a self-matching manner as shown in FIG. 9, it becomes possible to suppress variation in relative positional relations of the intermediate region 10 and the shield region 9 with respect to the first channel region 7. Therefore, it becomes possible to accurately reduce the potential barrier B (cf. FIGS. 10A to 10C) in the first channel region 7, so as to prevent a residual image from occurring as varying in each pixel inside the solid-state imaging element 1.

In addition, although the case has been illustrated in FIGS. 2 and 3 where the second channel region 8 is formed prior to the first channel region 7, the first channel region 7 may be formed prior to the second channel region 8. Further, although the case has been illustrated in FIGS. 4 and 5 where the charge storage region 5 is formed prior to the read region 6, the read region 6 may be formed prior to the charge storage region 5.

<Modification, Etc.>

The solid-state imaging element 1, structured to form the first channel region 7 and the second channel region 8 at the position inside the substrate 2 and immediately below the gate electrode 4, and the manufacturing method for the solid-state imaging element 1 have been illustrated in FIGS. 1A to 9, but it may be structured to form only one channel region at the position inside the substrate 2 and immediately below the gate electrode 4.

Further, the solid-state imaging element 1 where electrons are stored in the n-type charge storage region 5 has been illustrated in FIGS. 1A to 9, but the p-type and the n-type of the substrate 2 and the respective regions 5 to 10 inside the substrate 2 may be reversed. In this case, the solid-state imaging element 1 becomes one to store holes in the p-type charge storage region 5.

However, even in this case, it is assumed that the concentration of the n-type impurities in the intermediate region 10 is lower than the concentration of the n-type impurities of the conductive type in the shield region 9. Further, it is preferably assumed that the concentration of the n-type impurities in the intermediate region 10 is higher than the concentration of the n-type impurities in the first channel region 7 and the second channel region 8.

Specifically, it is preferable that the concentration of the n-type impurities in the intermediate region 10 is not lower than $3 \times 10^{17}$ cm$^{-3}$ and not higher than $3 \times 10^{18}$ cm$^{-3}$, the concentration of the n-type impurities in the shield region 9 is not lower than $1 \times 10^{18}$ cm$^{-3}$ and not higher than $1 \times 10^{19}$ cm$^{-3}$, and the concentration of the n-type impurities in the first channel region 7 and the second channel region 8 is not lower than $3 \times 10^{16}$ cm$^{-3}$ and not higher than $3 \times 10^{17}$ cm$^{-3}$.

As the description of the solid-state imaging element 1 and the manufacturing method for the solid-state imaging element 1 according to the embodiment of the present invention, the case of the solid-state imaging element 1 being the CMOS image sensor has been illustrated, but the present invention is not restricted to the CMOS image sensor, and it is also applicable to another solid-state imaging element such as a CCD image sensor.

INDUSTRIAL APPLICABILITY

A solid-state imaging element and a method for manufacturing the solid-state imaging element according to the present invention can, for example, be used for a CMOS image sensor, a CCD image sensor and the like which are mounted in a variety of electronic equipment having an imaging function.

DESCRIPTION OF SYMBOLS

1 solid-state imaging element
2 substrate
2a top surface
3 gate insulating film
4 gate electrode
5 charge storage region
6 read region
7 first channel region
8 second channel region
9 shield region
10 intermediate region
11 side wall
12 side wall
13 element separation part

The invention claimed is:

1. A solid-state imaging element, comprising:
a substrate including a semiconductor of a first conductive type;
a gate insulating film on a top surface of the substrate;
a gate electrode on the gate insulating film;
a side wall on a side surface of the gate electrode;
a charge storage region including a semiconductor of a second conductive type different from the first conductive type inside the substrate and apart from the top surface of the substrate;
a read region including the second conductive type semiconductor inside the substrate and on an opposite side to the charge storage region with the gate electrode interposed therebetween;
a channel region including the first conductive type semiconductor inside the substrate and immediately below the gate electrode;
a shield region including the first conductive type semiconductor inside the substrate and between the top surface of the substrate and the charge storage region; and
an intermediate region including the first conductive type semiconductor inside the substrate and between the top surface of the substrate and the charge storage region, wherein
the charge storage region extends to immediately below the gate electrode inside the substrate and is in contact with a lower end of the channel region,
the intermediate region is inside the substrate and between the channel region and the shield region and is immediately below the side wall, and is in contact with each of the channel region and the shield region, and a concentration of impurities of the first conductive type in the intermediate region is lower than a concentration of the impurities of the first conductive type in the shield region,
the channel region includes a first channel region that is in contact with the charge storage region, and a second channel region that is in contact with the read region and the first channel region, and
the second channel region includes a portion protruding toward the charge storage region with respect to an end of the first channel region on a side of the read region, an upper surface of the portion is directly in contact with a lower surface of the first channel region, and the portion and the charge storage region are separate from each other.

2. The solid-state imaging element according to claim 1, wherein the concentration of the first conductive type impurities in the intermediate region is higher than a concentration of the first conductive type impurities in the channel region.

3. The solid-state imaging element according to claim 2, wherein
the concentration of the first conductive type impurities in the shield region is not lower than $1 \times 10^{18}$ cm$^{-3}$ and not higher than $1 \times 10^{19}$ cm$^{-3}$,
the concentration of the first conductive type impurities in the intermediate region is not lower than $3 \times 10^{17}$ cm$^{-3}$ and not higher than $3 \times 10^{18}$ cm-3, and
the concentration of the first conductive type impurities in the channel region is not lower than $3 \times 10^{16}$ cm$^{-3}$ and not higher than $3 \times 10^{17}$ cm-3.

4. The solid-state imaging element according to claim 1, wherein a portion of the charge storage region, which extends to immediately below the gate electrode, has a length not smaller than 50 nm and not larger than 250 nm.

5. The solid-state imaging element according to claim 1, wherein an end of the first channel region on a side closest to the read region protrudes toward the read region more than an end of the charge storage region on a side closest to the read region.

* * * * *